United States Patent [19]

Nakanishi

[11] Patent Number: 5,786,610

[45] Date of Patent: Jul. 28, 1998

[54] FIELD EFFECT TRANSISTOR

[75] Inventor: Mamiko Nakanishi, Tokyo, Japan

[73] Assignee: Mitsubishi Denki Kabushiki Kaisha, Tokyo, Japan

[21] Appl. No.: 715,414

[22] Filed: Sep. 18, 1996

[30] Foreign Application Priority Data

May 30, 1996 [JP] Japan ................................ 8-136310

[51] Int. Cl.$^6$ ............................ H01L 29/80; H01L 31/112
[52] U.S. Cl. ............................ 257/280; 257/279; 257/283; 257/284
[58] Field of Search ............................ 257/279, 280, 257/283, 284, 192, 194

[56] References Cited

FOREIGN PATENT DOCUMENTS

| 1138762 | 5/1989 | Japan . |  |
|---|---|---|---|
| 0697199 | 4/1994 | Japan | 257/280 |
| 7169976 | 7/1995 | Japan . |  |

Primary Examiner—Wael Fahmy
Attorney, Agent, or Firm—Leydig, Voit & Mayer, Ltd.

[57] ABSTRACT

A field effect transistor includes an active layer having a surface; a source electrode and a drain electrode disposed on the surface of the active layer; a first gate electrode disposed on the surface of the active layer between the source electrode and the drain electrode, having a T-shaped cross section, and a lower layer and an upper layer, the lower layer contacting the active layer, and the upper layer being disposed on the lower layer and having a lower resistivity than the lower layer, and being longer than the lower layer in the direction parallel to the gate length; and a second gate electrode disposed on the surface of the active layer between the first gate electrode and the drain electrode, having a rectangular cross section and a single layer. The gate resistance of the first gate electrode is reduced, whereby efficiency is improved and noise is reduced. Further, since the second gate electrode has a single-layer structure, the size of the FET is reduced, so the distance between the first gate electrode and the drain electrode is reduced, resulting in a reduction in the parasitic drain resistance.

5 Claims, 11 Drawing Sheets

FIELD EFFECT TRANSISTOR

FIELD OF THE INVENTION

The present invention relates to a field effect transistor (hereinafter referred to as an FET) and, more particularly, to a dual-gate FET including two gate electrodes.

BACKGROUND OF THE INVENTION

FIG. 14 is a cross-sectional view illustrating a conventional dual-gate FET. This dual-gate FET includes a semi-insulating GaAs substrate 1. An n type GaAs active layer 2 is disposed on the substrate 1. A source electrode 5 and a drain electrode 6, both comprising 200 nm thick AlGe/Ni, are disposed on the active layer 2, making ohmic contacts with the active layer 2. Between the source electrode 5 and the drain electrode 6, a first gate electrode 103 and a second gate electrode 104 are disposed on the active layer 2. These gate electrodes 103 and 104 are in Schottky contact with the active layer 2. When this dual-gate FET is used as an amplifier, a high frequency signal is applied to the first gate electrode 103, and a d.c. voltage for controlling a source-drain current is applied to the second gate electrode 104. When this dual-gate FET is used as a mixer, high frequency signals are applied to both the first gate electrode 103 and the second gate electrode 104.

In a dual-gate FET, in order to reduce noise or increase efficiency, the gate resistance must be reduced.

FIG. 15 shows a dual-gate FET proposed with the object to reduce the gate resistance. This dual-gate FET includes a first gate electrode 3 comprising a WSi lower layer 3b and an Au upper layer 3a, and a second gate electrode 4 comprising a WSi lower layer 4b and an Au upper layer 4a. The Au upper layer 3a (4a) has a resistivity lower than that of the WSi lower layer 3b (4b) and is longer than the lower layer 3b (4b) in the gate length direction.

The dual-gate FET having the double-layer first and second gate electrodes 3 and 4 is fabricated in the process steps shown in FIGS. 16(a)–16(f).

Initially, as illustrated in FIG. 16(a), an n type GaAs layer is epitaxially grown on the semi-insulating GaAs substrate 1, and the n type GaAs layer except a region where an FET is later fabricated, is made insulating by ion implantation, producing the n type GaAs active layer 2. Thereafter, the source electrode 5 and the drain electrode 6, both comprising 200 nm thick AuGe/Ni, are formed on the active layer 2 by vacuum evaporation and lift-off. Further, the WSi lower layer 3b of the first gate electrode and the WSi lower layer 4b of the second gate electrode are produced. The source electrode 5 and the drain electrode 6 are produced so that these electrodes make ohmic contacts with the active layer 2, and the WSi lower layers 3b and 4b are produced so that these layers make Schottky contacts with the active layer 2.

Next, an SiON film 7 having a thickness of 200 nm is deposited over the entire surface by plasma CVD (FIG. 16(b)), and an SiO film 8 having a thickness of 300 nm is deposited on the SiON film 7 by plasma CVD to make the surface flat (FIG. 16(c)). Thereafter, the SiO film 6 and an upper portion of the SiON film 7 are etched and removed to expose the WSi lower layers 3b and 4b at the surface of the SiON film 7 (FIG. 16(d)).

In the step of FIG. 16(e), a resist 9 is applied to the entire surface and patterned to form two openings wider than the WSi lower layers 3b and 4b, opposite the WSi lower layers 3b and 4b, respectively. Thereafter, an Au layer 10 is deposited over the entire surface by sputtering, and the resist 9 and unnecessary portions of the Au layer on the resist 9 are removed by the lift-off technique (FIG. 16(f)).

Finally, the SiON film 7 is removed with BHF (buffered HF), completing the dual-gate FET having the first gate electrode 3 comprising the WSi lower layer 3b and the Au upper layer 3a, and the second gate electrode 4 comprising the WSi lower layer 4b and the Au upper layer 4a.

In the dual-gate FET so fabricated, as shown in FIGS. 16(a) and 16(f), the source electrode to first gate electrode distance $L_{g1s}$ is 2.0 μm, the first gate electrode length $L_{g1}$ is 0.5 μm, the first gate electrode to second gate electrode distance $L_{g1g2}$ is 2.0 μm, the second gate electrode length $L_{g2}$ is 0.5 μm, and the second gate electrode to drain electrode distance $L_{g2d}$ is 2.0 μm. In addition, the first gate electrode upper length $L_{g1u}$ is 2.0 μm, and the second gate electrode upper length $L_{g1u}$ is 2.0 μm. Therefore, the source electrode to drain electrode distance $L_{sd}$ is 7.0 μm, and the first gate electrode to drain electrode distance $L_{g1d}$ is 4.5 μm.

In this FET, since the first gate electrode and the second gate electrode 4 have larger upper layers 3a and 4a than lower layers 3b and 4b in the gate length direction, respectively, the source electrode to drain electrode distance is larger than that in the dual-gate FET having the single-layer gate electrodes 103 and 104 shown in FIG. 14, resulting in an increase in the size of the FET. Further, since the first gate electrode to drain electrode distance is large, the parasitic drain resistance increases, whereby the high frequency characteristics are degraded.

SUMMARY OF THE INVENTION

An object of the present invention is to provide a dual-gate FET that reduces the gate resistance while suppressing an increase in the FET size and an increase in the parasitic drain resistance.

Another object of the present invention is to provide a method of fabricating the dual-gate FET.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a field effect transistor comprises an active layer having a surface; a source electrode and a drain electrode disposed on the surface of the active layer; a first gate electrode disposed on the surface of the active layer between the source electrode and the drain electrode, having a T-shaped cross section and comprising a lower layer and an upper layer, the lower layer comprising a material having a resistivity and contacting the active layer, and the upper layer being disposed on the lower layer, comprising a material having a resistivity lower than the resistivity of the lower layer, and being longer than the lower layer in the direction parallel to the gate length; and a second gate electrode disposed on the surface of the active layer between the first gate electrode and the drain electrode, having a rectangular cross section and comprising a single layer. Therefore, the gate resistance of the first gate electrode is reduced, whereby the efficiency is improved and the noise is reduced. Further, since the second gate electrode has a single-layer structure, the size of the FET is reduced, whereby the distance between the first gate electrode and the drain electrode is reduced, resulting in a reduction in the parasitic drain resistance.

According to a second aspect of the present invention, in the above-mentioned field effect transistor, the active layer has a gate recess at the surface, and the first gate electrode is disposed in the gate recess. Therefore, unwanted reduction in drain current due to an electric charge depletion layer extending in the active layer beneath the second gate electrode is suppressed.

According to a third aspect of the present invention, a field effect transistor comprises an active layer having a surface; a source electrode and a drain electrode disposed on the surface of the active layer; the active layer having, at the surface, a double-stage first gate recess between the source electrode and the drain electrode and a single-stage second gate recess between the first gate recess and the drain electrode, the double-stage first gate recess comprising a first-stage recess having an opening at the surface of the active layer and a second-stage recess having an opening at the bottom of the first-stage recess and a depth from the bottom of the first-stage recess, and the single-stage second gate recess having a depth equal to the depth of the second-stage recess; a first gate electrode disposed in the second-stage recess of the double-stage first gate recess and comprising a lower layer and an upper layer, the lower layer comprising a material having a resistivity and contacting the active layer, and the upper layer being disposed on the lower layer and comprising a material having a resistivity lower than the resistivity of the lower layer; and a second gate electrode disposed in the signal-stage second gate recess. Therefore, the gate resistance is reduced, whereby the efficiency is improved and the noise is reduced. Further, since the first gate electrode is disposed in the second-stage recess of the double-stage first gate recess and the second gate electrode is disposed in the single-stage second gate recess, unwanted reduction in drain current due to an electric charge depletion layer extending in the active layer beneath the second gate electrode is suppressed. Furthermore, the parasitic resistance in the active layer in the vicinity of the second gate electrode is reduced.

According to a fourth aspect of the present invention, a field effect transistor comprises an active layer having a surface and a first conductivity type; a source electrode and a drain electrode disposed on the surface of the active layer; a first gate electrode disposed on the surface of active layer between the source electrode and the drain electrode and comprising a lower layer and an upper layer, the lower layer comprising a material having a resistivity and contacting the active layer, and the upper layer being disposed on the lower layer, comprising a material having a resistivity lower than the resistivity of the lower layer, and being longer than the lower layer in the direction parallel to the gate length; and an electrically conductive region produced in the active layer, reaching the surface of the active layer, between the first gate electrode and the drain electrode, the electrically conductive region having a second conductivity type, opposite the first conductivity type, and controlling a current flowing through the active layer. Therefore, the gate resistance of the first gate electrode is reduced, whereby the efficiency is improved and the noise is reduced during the high frequency operation of the FET. Further, since the electrically conductive region, which corresponds to the above-mentioned second gate electrode for controlling a current flowing across the source and the drain, is not an electrode disposed on the active layer but a semiconductor region produced in the active layer, the distance between the conductive layer and the drain electrode is reduced, and the parasitic drain resistance is reduced. Further, the distance between the first gate electrode and the conductive layer is also reduced. As a result, the distance between the source electrode and the drain electrode is reduced, whereby the size of the FET is reduced.

According to a fifth aspect of the present invention, a field effect transistor comprises an active layer having a surface; a source electrode and a drain electrode disposed on the surface of the active layer; a first gate electrode disposed on the surface of the active layer between the source electrode and the drain electrode; and a second gate electrode disposed on the surface of the active layer between the first gate electrode and the drain electrode. In a half of the FET from the center of the FET in the direction perpendicular to the gate length, the first gate electrode being a T-shaped electrode comprising a lower layer and an upper layer, the lower layer comprising a material having a resistivity and contacting the active layer, and the upper layer being disposed on the lower layer, comprising a material having a resistivity lower than the resistivity of the lower layer, and being longer than the lower layer in the direction parallel to the gate length, while the second gate electrode being a rectangular electrode comprising a single layer. In the other half of the FET, the first gate electrode being a rectangular electrode comprising a single layer while the second gate electrode being a T-shaped electrode comprising a lower layer and an upper layer, the lower layer comprising a material having a resistivity and contacting the active layer, and the upper layer being disposed on the lower layer, comprising a material having a resistivity lower than the resistivity of the lower layer, and being longer than the lower layer in the direction parallel to the gate length. Therefore, the gate resistances of the first and second gate electrodes are reduced, and the source electrode to drain electrode distance is reduced compared to the conventional FET shown in FIG. 15, whereby the size of the FET is reduced.

According to a sixth aspect of the present invention, a method of fabricating a field effect transistor comprises steps of forming an active layer on a semiconductor substrate; forming a source electrode and a drain electrode on the active layer; forming a lower layer of a first gate electrode having a resistivity and a second gate electrode on a region of the active layer between the source electrode and the drain electrode so that the lower layer of the first gate electrode is on the source electrode side and the second gate electrode is on the drain electrode side; depositing a first insulating film over the entire surface, and depositing a second insulating film over the first insulating film to make the surface flat; etching and removing the second insulating film and an upper portion of the first insulating film to expose upper surfaces of the lower layer of the first gate electrode and the second gate electrode at the surface of the first insulating film; forming a resist film over the entire surface and patterning the resist film to form an opening wider than the lower layer of the first gate electrode, opposite the lower layer of the first gate electrode; depositing an electrically conductive material having a resistivity lower than the resistivity of the lower layer of the first gate electrode, over the entire surface; and removing the resist film and unnecessary portions of the electrically conductive material on the resist film to produce an upper layer of the first gate electrode, comprising the electrically conductive material and being longer than the lower layer of the first gate electrode, on the lower layer of the first gate electrode.

According to a seventh aspect of the present invention, a method of fabricating a field effect transistor comprises steps of forming an active layer on a semiconductor substrate; forming a gate recess in a region of the active layer where a first gate electrode is later produced; forming a lower layer of a first gate electrode, having a resistivity, in the gate recess and a second gate electrode on the active layer, spaced apart from the first gate electrode; depositing a first insulating film over the entire surface, and depositing a second insulating film on the first insulating film to make the surface flat; etching and removing the second insulating film and an upper portion of the first insulating film to expose upper surfaces of the lower layer of the first gate electrode and the second gate electrode at the surface of the first insulating film; forming a resist film over the entire surface and patterning the resist film to form an opening wider than the lower layer of the first gate electrode, opposite the lower layer of the first gate electrode; depositing an electrically conductive material having a resistivity lower than the resistivity of the lower layer of the first gate electrode, over the entire surface; removing the resist film and unnecessary portions of the electrically conductive material on the resist film to produce an upper layer of the first gate electrode on the lower layer of the first gate electrode, the upper layer comprising the electrically conductive material and being longer than the lower layer of the first gate electrode; and producing a source electrode and a drain electrode on the active layer, sandwiching the first gate electrode and the second gate electrodes.

According to an eighth aspect of the present invention, the above-mentioned fabrication method further comprises steps of, after formation of the gate recess and before formation of the lower layer of the first gate electrode and the second gate electrode, depositing an insulating film over the entire surface of the active layer; anisotropically etching the insulating film to form side walls on the side surfaces in the gate recess; depositing an electrically conductive film over the entire surface; forming resist films on regions of the electrically conductive film where the lower layer of the first gate electrode and the second gate electrode are later produced; and etching the electrically conductive film using the resist films as masks and removing the resist films, thereby producing the lower layer of the first gate electrode and the second gate electrode.

According to a ninth aspect of the present invention, a method of fabricating a field effect transistor comprises steps of forming an active layer on a semiconductor substrate; forming a first-stage recess of a double-stage first gate recess at the surface of the active layer; depositing a first insulating film over the entire surface of the active layer and removing portions of the first insulating film opposite a region in the first-stage recess where a first gate electrode is later produced and a region where a second gate electrode is later produced; using the first insulating film as a mask, etching the active layer to form a second-stage recess of the double-stage first gate recess in the first-stage recess and a single-stage second gate recess; depositing a second insulating film over the entire surface and anisotropically etching the second insulating film to form side walls comprising the second insulating film on the side surfaces in the second-stage recess of the double-stage first gate recess and on side surfaces in the single-stage second gate recess; depositing a first electrically conductive film comprising a material having a first resistivity and a second electrically conductive film comprising a material having a second resistivity lower than the first resistivity on the entire surface; etching and removing portions of the second electrically conductive film and the first electrically conductive film, leaving a first gate electrode comprising the first and second electrically conductive films in the second-stage recess of the double-stage first gate recess and a second gate electrode comprising the first and second electrically conductive films in the single-stage second gate recess; and producing a source electrode and a drain electrode on the active layer, sandwiching the first and second gate electrodes with the source electrode on the first gate electrode side and the drain electrode on the second gate electrode side.

According to a tenth aspect of the present invention, a method of fabricating a field effect transistor comprises steps of producing an active layer having a first conductivity type on a semiconductor substrate; producing a source electrode and a drain electrode on the active layer; producing a lower layer of a first gate electrode having a resistivity on the active layer between the source electrode and the drain electrode; producing an electrically conductive region in the active layer between the lower layer of the first gate electrode and the drain electrode, reaching the surface of the active layer, the region having a second conductivity type, opposite the first conductivity type, and controlling a current flowing through the active layer; depositing a first insulating film over the entire surface and depositing a second insulating film over the first insulating film to make the surface flat; etching and removing the second insulating film and an upper portion of the first insulating film to expose an upper surface of the lower layer of the first gate electrode at the surface of the first insulating film; forming a resist film on the second insulating film and patterning the resist film to form an opening wider than the lower layer of the first gate electrode, opposite the lower layer of the first gate electrode; depositing an electrically conductive film having a resistivity lower than the resistivity of the lower layer of the first gate electrode over the entire surface; removing the resist film and unnecessary portions of the electrically conductive film on the resist film, thereby producing an upper layer of the first gate electrode on the lower layer of the first gate electrode, the upper layer comprising the electrically conductive film and being longer than the lower layer of the first gate electrode in the direction parallel to the gate length. In this method, since the structure of the electrically conductive region is simplified as compared to the second gate electrode mentioned above, the fabrication process is facilitated.

According to an eleventh aspect of the present invention, the above-mentioned fabrication method further comprises steps of, after formation of the lower layer of the first gate electrode, forming a resist film having an opening opposite a portion of the active layer between the lower layer of the first gate electrode and the drain electrode; and using the resist film as a mask, implanting dopant ions having the second conductivity type into the active layer to form the electrically conductive region at the surface of the active layer exposed in the opening of the resist film. Therefore, the electrically conductive region is easily produced.

According to a twelfth aspect of the present invention, the above-mentioned fabrication method further comprises steps of, after formation of the lower layer of the first gate electrode, forming side walls comprising an insulating material on both sides of the lower layer of the first gate electrode; forming a resist film having an opening opposite a region including a portion of the lower layer of the first gate electrode, the side wall on the drain electrode side, and a portion of the active layer where the electrically conductive region is later produced; and using the resist film as a mask, implanting dopant ions having the second conductivity type into the active layer to form the electrically conductive region at the surface of the active layer exposed in the opening of the resist film. Therefore, the electrically conductive region is easily produced. Further, since the distance between the lower layer of the first gate electrode and the conductive layer is determined by the thickness of the side wall, the conductive layer is produced in the vicinity of the first gate electrode.

According to a thirteenth aspect of the present invention, the above-mentioned fabrication method further comprises steps of, after formation of the lower layer of the first gate electrode, forming an insulating film having an opening between the lower layer of the first gate electrode and the drain electrode; and using the insulating film as a mask, diffusing an impurity dopant having the second conductivity type into the active layer to form the electrically conductive region at the surface of the active layer exposed in the opening of the insulating film. Therefore, the electrically conductive layer is easily produced.

According to a fourteenth aspect of the present invention, the above-mentioned fabrication method further comprises a step of, after formation of the lower layer of the first gate electrode, using a focused ion beam, implanting dopant ions having the second conductivity type into a portion of the active layer between the lower layer of the first gate electrode and the drain electrode, thereby producing the electrically conductive region at the surface of the active layer. Therefore, the electrically conductive layer is easily produced.

DETAILED DESCRIPTION OF THE PREFERRED EMBODIMENTS

Figure 1:
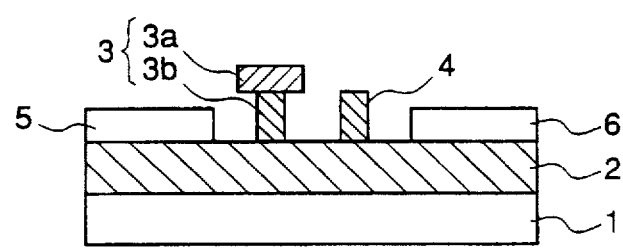
FIG. 1 is a cross-sectional view illustrating a dual-gate FET in accordance with a first embodiment of the present invention.

FIG. 1 is a cross-sectional view illustrating a dual-gate FET in accordance with a first embodiment of the present invention. This dual-gate FET includes a semi-insulating GaAs substrate 1. An n type GaAs active layer 2 is disposed on the substrate 1. A source electrode 5 and a drain electrode 6, both comprising AuGe/Ni, are disposed on the active layer 2, making ohmic contacts with the active layer 2. Between the source electrode 5 and the drain electrode 6, a first gate electrode 3 and a second gate electrode 4 are disposed on the active layer 2. The first gate electrode 3 is a T-shaped electrode having a double-layer structure, i.e., it comprises a lower layer 3b comprising WSi and an upper layer 3a comprising Au that is longer than the lower layer 3b in the gate length direction. The second gate electrode 4 is a rectangular electrode comprising a single layer of WSi. The gate electrodes 3 and 4 are in Schottky contact with the n type GaAs active layer 2. In this first embodiment of the invention, only the first gate electrode 3 to which a high frequency signal is applied when the dual-gate FET is used as an amplifier has a double-layer structure, and the second gate electrode to which a d.c. voltage for controlling the source-drain current is applied has a single-layer structure.

FIGS. 2(a)–2(f) are cross-sectional views illustrating process steps in a method of fabricating the dual-gate FET shown in FIG. 1.

Figure 2:
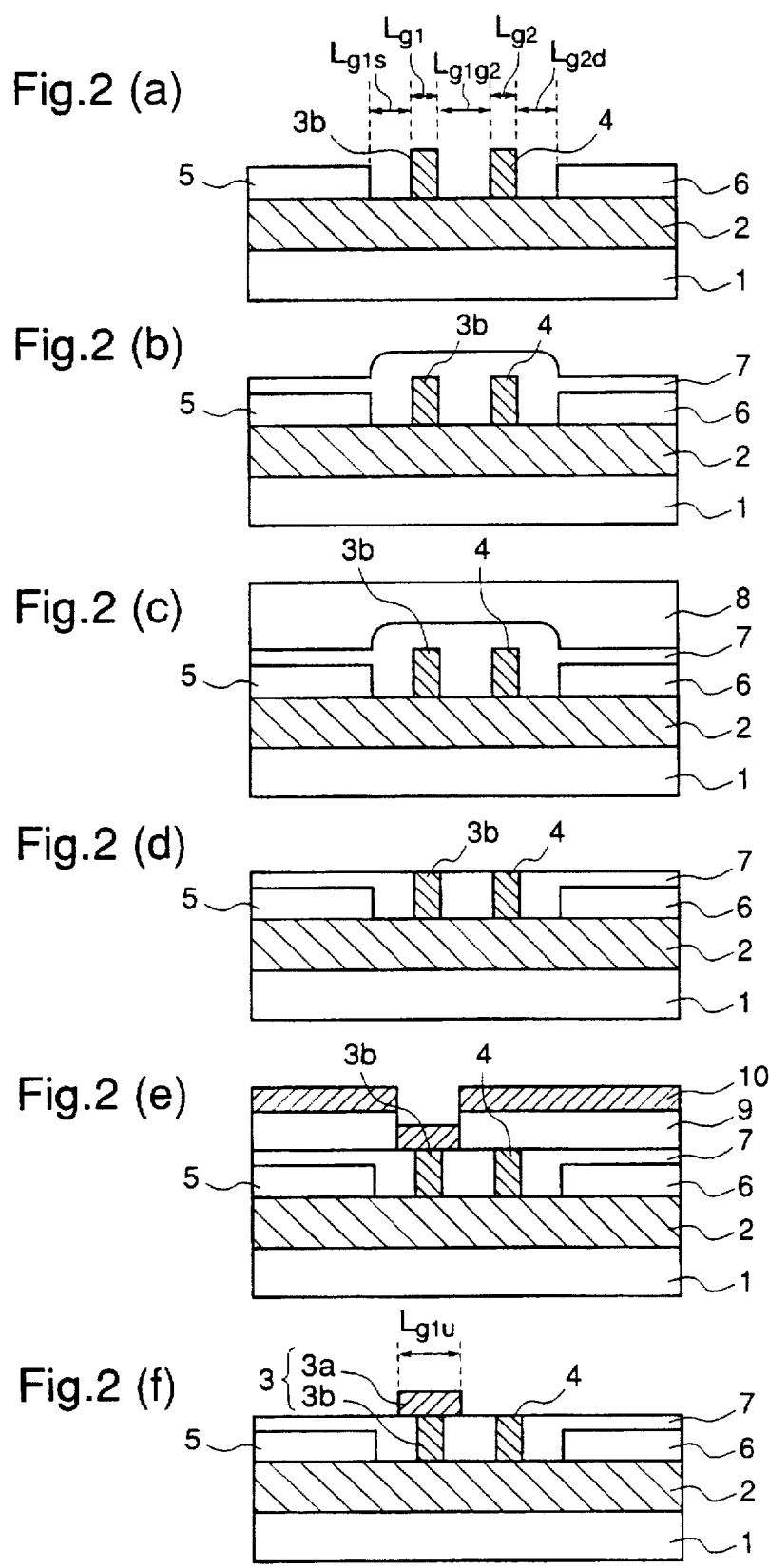
FIGS. 2(a)–2(f) are cross-sectional views illustrating process steps in a method of fabricating the dual-gate FET according to the first embodiment of the invention.

Initially, as illustrated in FIG. 2(a), a 500 nm thick n type GaAs layer is epitaxially grown on the semi-insulating GaAs substrate 1, and the n type GaAs layer, except a region where an FET is later fabricated, is removed by etching or made insulating by implantation of H ions, producing an n type GaAs active layer 2. In the figure, only the active layer 2 in the FET formation region is shown. The n type GaAs active layer 2 may be formed by implanting n type-producing dopant ions into a region of the semi-insulating GaAs substrate. In this case, a 500 nm thick n type GaAs active layer is produced by implanting $Si^+$ ions at an accelerating voltage of 100 keV. Thereafter, a source electrode 5 and a drain electrode 6, both comprising 200 nm thick AuGe/Ni, are formed on the active layer 2 by vacuum evaporation and lift-off. Further, a lower first gate electrode 3b an d a second gate electrode 4, both comprising 300 nm thick WSi, are produced on the active layer 2.

Next , a 200 nm thick SiON film 7 is deposited over the entire surface by plasma CVD (FIG. 2(b)), and a 300 nm thick SiO film 8 is deposited on the SiON film 7 by plasma CVD to make the surface flat (FIG. 2(c)). Thereafter, as shown in FIG. 2(d), the SiO film 8 and an upper portion of the SiON film 7 are etched and removed to expose the lower first gate electrode 3b and the second gate electrode 4 at the surface of the SiON film 7.

In the step of FIG. 2(e), a resist 9 is applied to the entire surface and patterned to form an opening wider than the lower first gate electrode 3b, opposite the WSi lower layer 3b, and a 700 nm thick Au layer is deposited on the entire surface by sputtering. Thereafter, the resist 9 and unnecessary portions of the Au layer on the resist 9 are removed by the lift-off technique, producing an upper first gate electrode 3a comprising Au (FIG. 2(f)).

Finally, the SiON film 7 is etched and removed with BHF, completing the dual-gate FET having the double-layer first gate electrode 3 and the single-layer second gate electrode 4.

In the dual-gate FET so fabricated, as shown in FIGS. 2(a) and 2(f), the source electrode to first gate electrode distance $L_{g1s}$ is 1.0 μm, the first gate electrode length $L_{g1}$ is 0.5 μm, the first gate electrode to second gate electrode distance $L_{g1g2}$ is 1.25 μm, the second gate electrode length $L_{g2}$ is 0.5 μm, and the second gate electrode to drain electrode distance $L_{g2d}$ is 1.0 μm. In addition, the length of the upper layer of the first gate electrode $L_{g1u}$ is 2.0 μm. Therefore, the source electrode to drain electrode distance $L_{sd}$ is 4.25 μm, and the first gate electrode to drain electrode distance $L_{g1d}$ is 2.75 μm. In comparison with the conventional dual-gate FET in which both the first and second gate electrodes have the double-layer structures, the source electrode to drain electrode distance $L_{sd}$ is reduced by 2.75 μm, and the first gate electrode to drain electrode distance $L_{g1d}$ is reduced by 1.75 μm.

In the dual-gate FET according to this first embodiment, since the first gate electrode 3 is a T-shaped electrode having a double-layer structure, the resistance of this first gate electrode 3 is reduced, whereby efficiency is improved and noise is reduced. Further, since the second gate electrode is a rectangular electrode having a single-layer structure, the size of the FET and the parasitic drain resistance are reduced as compared to the conventional dual-gate FET shown in FIG. 15.

[Embodiment 2]

Figure 3:
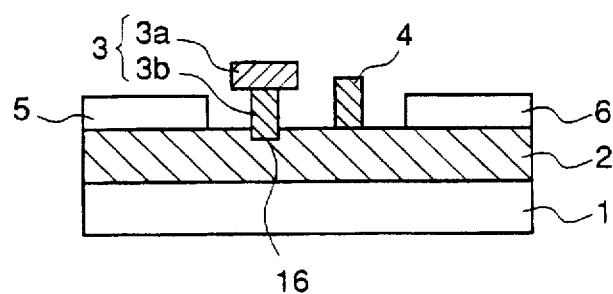
FIG. 3 is a cross-sectional view illustrating a dual-gate FET in accordance with a second embodiment of the present invention.

FIG. 3 is a cross-sectional view illustrating a dual-gate FET in accordance with a second embodiment of the present invention. In the figure, the same reference numerals as those shown in FIG. 1 designate the same or corresponding parts. This dual-gate FET comprises an n type GaAs active layer 2 having a gate recess 16 at the surface, a source electrode 5, a drain electrode 6, a first gate electrode 3 disposed in the gate recess 16, and a second gate electrode 4 disposed between the gate recess 16 and the drain electrode 6. The first gate electrode 3 comprises a WSi lower layer 3b disposed in the gate recess 16 and an Au upper layer 3a disposed on the lower layer 3b and longer than the lower layer 3b in the gate length direction. The second gate electrode 4 is a rectangular electrode comprising a single WSi layer.

FIGS. 4(a)–4(f) are cross-sectional views illustrating process steps in a method of fabricating the dual-gate FET shown in FIG. 3.

Initially, a 500 nm thick n type GaAs active layer 2 is formed on the semi-insulating GaAs substrate 1 in the same process as described for the first embodiment of the invention. Thereafter, as illustrated in FIG. 4(a), a portion of the n type GaAs active layer 2 at the surface where a first gate electrode is later produced is etched and removed to form a gate recess 16 having a length of 2.0 μm and a depth of 100 nm.

Figure 4:
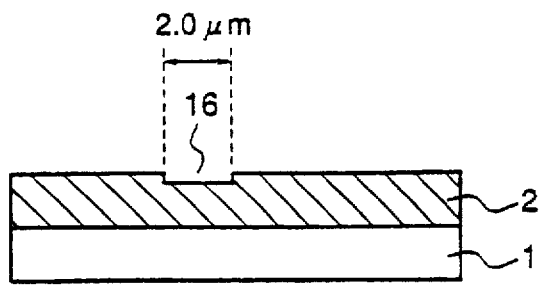
FIGS. 4(a)–4(f) are cross-sectional views illustrating process steps in a method of fabricating the dual-gate FET according to the second embodiment of the invention.
Figure 4:
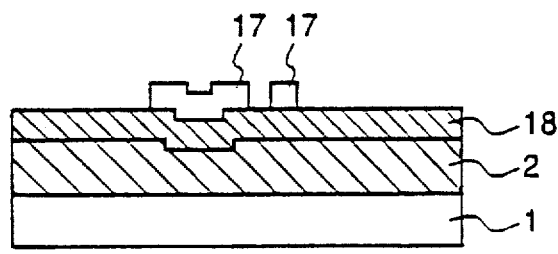
Figure 4:
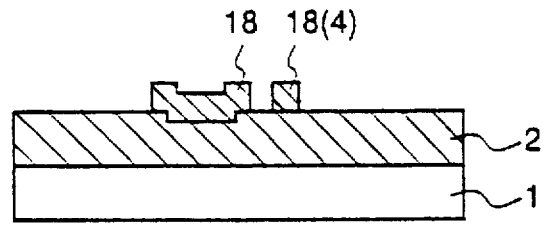
Figure 4:
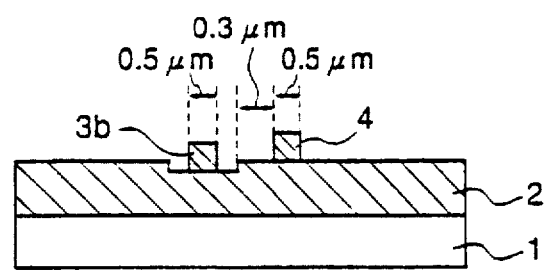
Figure 4:
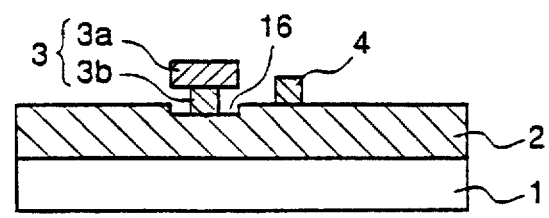
Figure 4:
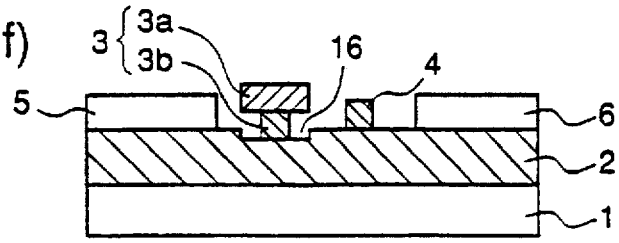

In the step of FIG. 4(b), a 200 nm thick WSi film 18 is deposited by sputtering, and resist patterns 17 are formed on a region including the gate recess 16 and on a region where a second gate electrode is later produced. Thereafter, the WSi film 18 is etched using the resist patterns 17 as masks. As a result of the etching, a portion of the WSi film 18 is left on the gate recess 16 and, simultaneously, a second gate electrode 4 comprising WSi is produced (FIG. 4(c)). The gate length of the second gate electrode 4 is 0.5 μm.

After removal of the resist 17, resist patterns (not shown) are formed on a portion of the surface of the WSi film 18 on the gate recess 16, and on a region including the second gate electrode 4, and the WSi layer 18 is etched using the resist patterns as masks, followed by removal of the resist patterns. As a result, a lower first gate electrode 3b is produced in the gate recess 16 (FIG. 4(d)). The length of the lower first gate electrode 3b at a part contacting the active layer 2, i.e., the gate length of the first gate electrode, is 0.5 μm.

In the step of FIG. 4(e), an upper first gate electrode 3a comprising Au is formed on the lower first gate electrode 3b in the same process as already described with respect to FIG. 2(e). Finally, as illustrated in FIG. 4(f), a source electrode 5 and a drain electrode 6, both comprising 200 nm thick AuGe/Ni, are produced on the active layer 2, completing the dual-gate FET in which the first gate electrode 3 is disposed in the gate recess 16.

FIGS. 5(a)–5(g) show process steps in an alternative method for fabricating the dual-gate FET according to this second embodiment.

Initially, a 500 nm thick n type GaAs active layer 2 is formed on the semi-insulating GaAs substrate 1 in the same process as described for the first embodiment of the invention. Thereafter, as illustrated in FIG. 5(a), a portion of the n type GaAs active layer 2 at the surface where a first gate electrode is later produced is etched and removed to form a gate recess 16 having a length of 2.0 μm and a depth of 100 nm.

Figure 5:
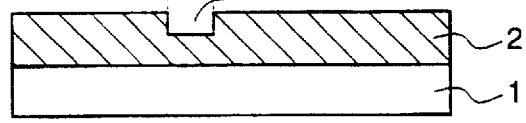
FIGS. 5(a)–5(g) are cross-sectional views illustrating process steps in a method of fabricating the dual-gate FET according to the second embodiment of the invention.
Figure 5:
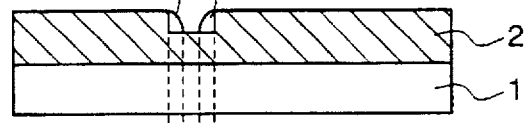
Figure 5:
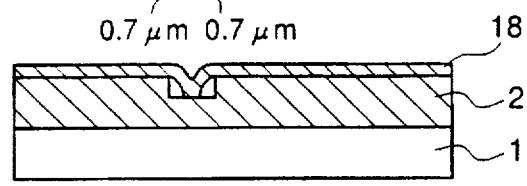
Figure 5:
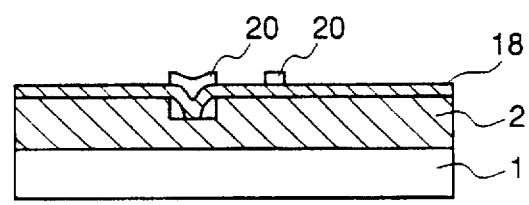
Figure 5:
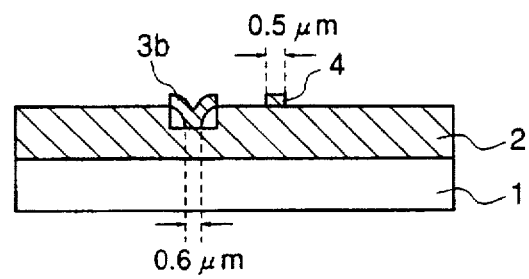
Figure 5:
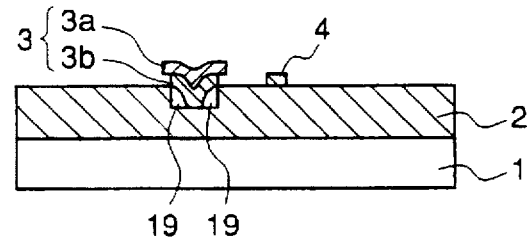
Figure 5:
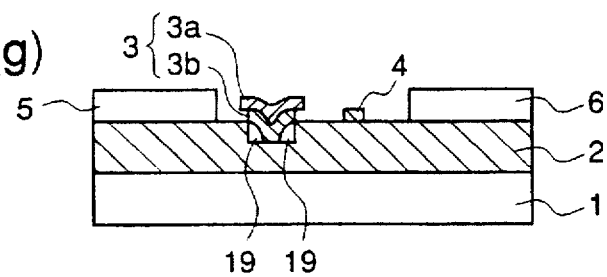

In the step of FIG. 5(b), an SiO film is deposited over the entire surface and anisotropically etched to form 0.7 μm thick SiO side walls 19 on the side surfaces in the gate recess 16.

Thereafter, a 200 nm thick WSi film 18 is deposited over the entire surface by sputtering (FIG. 5(c)), and resist patterns 20 are formed on a region opposite the gate recess 16 and on a region where a second gate electrode is later produced (FIG. 5(d)).

In the step of FIG. 5(e), the WSi film 18 is etched using the resist patterns 20 as masks, and the resist patterns 20 are removed, whereby a lower first gate electrode 3b comprising WSi is produced in the gate recess 16 and, simultaneously, a second gate electrode 4 comprising WSi is produced. The length of the lower first gate electrode 3b at a part contacting the active layer 2, i.e., the gate length of the first gate electrode, is 0.6 μm.

In the step of FIG. 5(f), an upper first gate electrode 3a comprising Au is formed on the lower first gate electrode 3b in the same process as already described with respect to FIG. 2(e). Finally, a source electrode 5 and a drain electrode 6, both comprising 200 nm thick AuGe/Ni, are produced on the active layer 2, completing the dual-gate FET in which the first gate electrode 3 is disposed in the gate recess 16.

In the dual-gate FET so fabricated, the source electrode to drain electrode distance $L_{sd}$ is 4.25 μm, and the first gate electrode to drain electrode distance $L_{g1d}$ is 2.75 μm. These distances are shorter than those of the dual-gate FET shown in FIG. 15 in which both the first gate electrode and the second gate electrode have the double-layer structures.

In the dual-gate FET according to this second embodiment of the invention, since the first gate electrode 3 receiving a high frequency signal is a T-shaped electrode having a double-layer structure, the resistance of this first gate electrode 3 is reduced, whereby efficiency is improved and, noise is reduced. Further, since the second gate electrode is a rectangular electrode having a single-layer structure, the size of the FET is reduced as compared with the FET shown in FIG. 15. In addition, since the distance between the first gate electrode 3 and the drain electrode 6 is reduced, the parasitic drain resistance is reduced by about 0.2 Ω. Further, since the first gate electrode 3 is disposed in the gate recess 16, the interface between the first gate electrode 3 and the active layer 2 is about 100 nm deeper than the interface between the second gate electrode 4 and the active layer 2. Thereby, a reduction in drain current due to charge depletion layer extending in the active layer beneath the second gate electrode 4 is suppressed.

[Embodiment 3]

Figure 6:
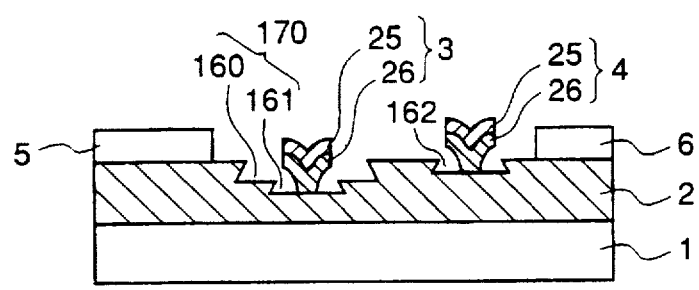
FIG. 6 is a cross-sectional view illustrating a dual-gate FET in accordance with a third embodiment of the present invention.

FIG. 6 is a cross-sectional view illustrating a dual-gate FET in accordance with a third embodiment of the present invention. In the figure, the same reference numerals as those shown in FIGS. 1 and 3 designate the same or corresponding parts. This dual-gate FET includes an n type GaAs active layer 2. A source electrode 5 and a drain electrode 6 are disposed on the active layer 2. The active layer 2 has, at the surface, a double-stage first gate recess 170 for a first gate electrode 3 and a single-stage second gate recess 162 for a second gate electrode 4. The double-stage first gate recess 170 comprises a first-stage recess 160 having a depth of 50 nm from the surface of the active layer 2 and a second-stage recess 161 positioned in the center of the first-stage recess 160 and having a depth of 50 nm from the bottom of the first-stage recess 160. A first gate electrode 3 is disposed on the bottom of the second-stage recess 161 of the double-stage first gate recess 170. The first gate electrode 3 comprises a 300 nm thick WSi layer (lower layer) 26 contacting the active layer 2 and a 700 nm thick Au layer (upper layer) 25 disposed on the WSi layer 26. A second gate electrode 4 is disposed in the single-stage second gate recess 162. The second gate electrode 4 comprises a 300 nm thick WSi layer (lower layer) 26 and a 700 nm thick Au layer (upper layer) 25.

FIGS. 7(a)–7(g) are cross-sectional views illustrating process steps in a method of fabricating a dual-gate FET shown in FIG. 6.

Initially, an n type GaAs active layer 2 is formed on the semi-insulating GaAs substrate 1 in the same process as described for the first embodiment of the invention. Thereafter, an SiN film (not shown) is deposited over the entire surface of the active layer 2 by plasma CVD, and a resist film (not shown) having a 4–5 µm wide opening opposite a region where a first stage of a double-stage gate recess is later formed is formed, on the SiN film. Using the resist film as a mask, the SiN film is anisotropically etched by RIE (Reactive Ion Etching). Thereafter, using the SiN film as a mask, the surface of the active layer 2 is etched with tartaric acid to form a first-stage recess 160 of a double-stage gate recess. The first-stage recess 160 is 50 nm deep and 4–5 µm wide.

Figure 7:
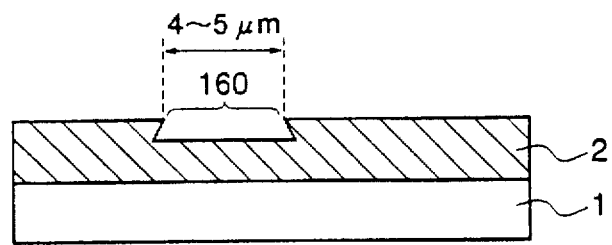
FIGS. 7(a)–7(g) are cross-sectional views illustrating process steps in a method of fabricating the dual-gate FET according to the third embodiment of the invention.
Figure 7:
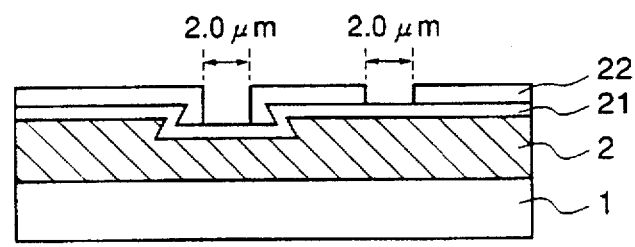
Figure 7:
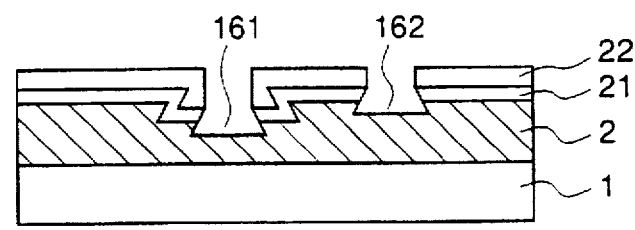
Figure 7:
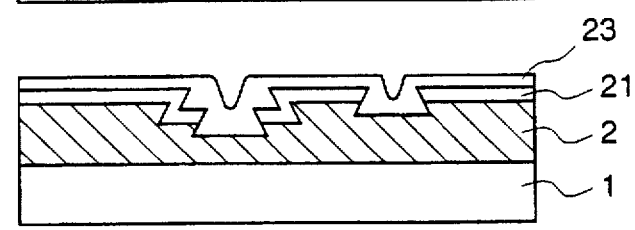
Figure 7:
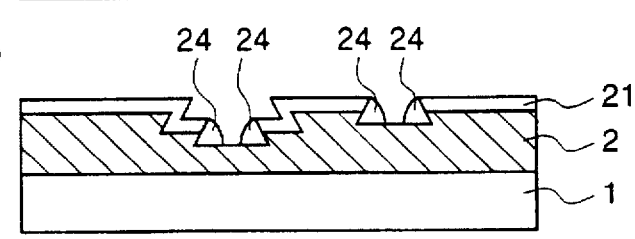
Figure 7:
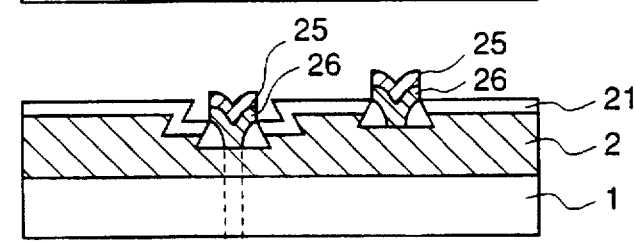
Figure 7:
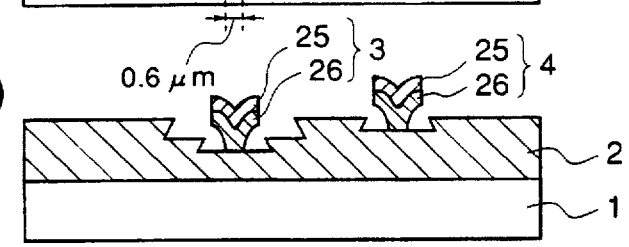

In the step of FIG. 7(b), after removal of the SiN film, a 400 nm thick SiO film 21, i.e., a first insulating film, is deposited over the entire surface of the active layer 2 by plasma CVD. Further, a resist 22 is applied to the entire surface of the SiO film 21 and patterned to form two 2 µm wide openings opposite a region within the first-stage recess 160, where a first gate electrode is later produced and a region on the drain side from the first-stage recess 160 where a second gate electrode 4 is later produced.

In the step of FIG. 7(c), using the resist 22 as a mask, the SiO film 21 is anisotropically etched by RIE, and the active layer 2 is etched with tartaric acid to a depth of 50 nm, thereby producing a second-stage recess 161 within the first-stage recess 160 and, simultaneously, a single-stage gate recess 162 for a second gate electrode.

In the step of FIG. 7(d), a 400 nm thick SiO film 23, i.e., a second insulating film, is deposited over the entire surface by ECR-CVD (Electron Cyclotron Resonance Chemical Vapor Deposition). Thereafter, as illustrated in FIG. 7(e), the SiO film 23 is anisotropically etched to form 0.7 µm thick SiO side walls 24 on the side surfaces of the second-stage recess 161 of the double-stage first gate recess and on the side surfaces of the single-stage second gate recess 162.

Thereafter, a 300 nm thick WSi film 26 and a 700 nm thick Au film 25 having a resistivity lower than that of the WSi film 26 are successively deposited over the entire surface by sputtering, and resist patterns (not shown) are formed on regions where a first gate electrode and a second gate electrode are later produced. Using the resist patterns as masks, the Au film 25 is etched by ion milling, and the WSi film 26 is etched by RIE with $CF_4$ and $O_2$, followed by the resist patterns. As a result, a first gate electrode 3 comprising two layers, i.e., the WSi film 26 and the Au film 25, is produced in the second-stage recess 161 of the double-stage first gate recess 170 and, simultaneously, a second gate electrode 4 comprising two layers, i.e., the WSi film 26 and the Au film 25, is produced in the single-stage second gate recess 162 (FIG. 7(f)). The length of each gate electrode at a part contacting the active layer 2, i.e., the gate length, is 0.6 µm.

In the step of FIG. 7(g), the SiO film 21 and the side walls 24 are removed. To complete the dual-gate FET shown in FIG. 6, a source electrode 5 and a drain electrode 6, both comprising 200 nm thick AuGe/Ni, are produced on the surface of the n type GaAs active layer 2.

In the dual-gate FET according to this third embodiment, since each of the first and second gate electrodes 3 and 4 comprises the lower layer 26 comprising WSi and the upper layer 25 comprising Au that has a resistivity lower than that of WSi, the gate resistance is reduced, whereby efficiency is improved and the noise is reduced. Further, the depth of the interface between the first gate electrode 3 and the active layer 2 from the surface of the substrate is 100 nm. The total of the depths of the first-stage recess 160 and the second-stage recess 161 is 100 nm, and this is 50 nm deeper than the depth of the interface between the second gate electrode 4 and the active layer from the surface of the substrate. Therefore, an unwanted reduction in the drain current due to charge depletion layer produced in the active layer 2 opposite the second gate electrode 4 is suppressed. Further, since the second gate electrode 4 is disposed in the single-stage second gate recess 162, the parasitic resistance of the active layer 2 in the vicinity of the second gate electrode 4 is reduced.

[Embodiment 4]

Figure 8:
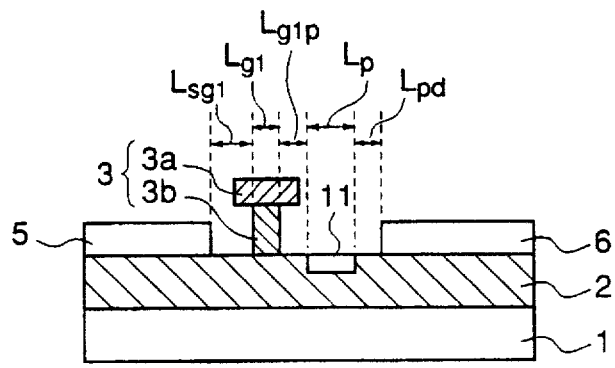
FIG. 8 is a cross-sectional view illustrating a dual-gate FET in accordance with a fourth embodiment of the present invention.

FIG. 8 is a cross-sectional view illustrating a dual-gate FET in accordance with a fourth embodiment of the present invention. In the figure, the same reference numerals as those shown in FIG. 1 designate the same or corresponding parts. In this dual-gate FET, a source electrode 5 and a drain electrode 6, both comprising 200 nm thick AuGe/Ni, are disposed on an n type GaAs active layer 2. Between the source electrode 5 and the drain electrode 6, a first gate electrode 3 comprising a 300 nm thick WSi lower layer 3b and a 700 nm thick Au upper layer 3a longer than the lower layer 3b in the gate length direction is disposed on the active layer 2. Between the drain electrode 6 and the first gate electrode 3, a p type GaAs electrically conductive region 11 for controlling current flowing through the active layer 2 is produced at the surface of the active layer 2. The thickness of charge depletion layer produced at the p-n junction between the p type GaAs conductive region 11 and the n type GaAs active layer 2 is controlled with a voltage applied to the p type GaAs conductive region 11, whereby current flowing through the active layer 2 between the source and the drain is controlled. In FIG. 8, $L_{sg1}$ denotes the distance between the source electrode 5 and the lower layer 3b of the first electrode 3. $L_{g1}$ denotes the length of the lower layer 3b of the first gate electrode 3. $L_{g1p}$ denotes the distance between the lower layer 3b of the first gate electrode 3 and the conductive region 11, $L_p$ denotes the length of the conductive region 11, and $L_{pd}$ denotes the distance between the conductive region 11 and the drain electrode 6.

Figure 9:
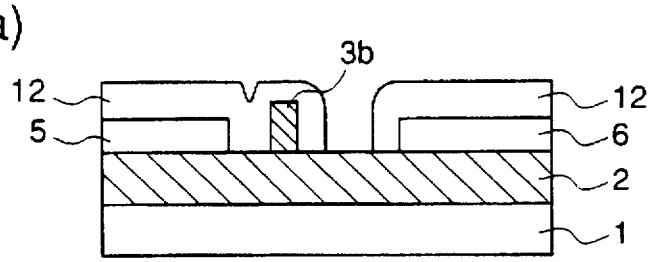
FIGS. 9(a) and 9(b) are cross-sectional views illustrating process steps in a method of fabricating the dual-gate FET according to the fourth embodiment of the invention.
Figure 9:
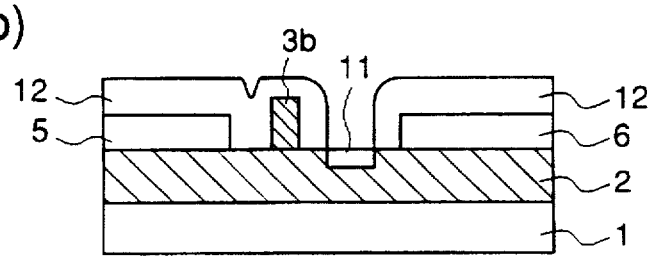

FIGS. 9(a) and 9(b) are cross-sectional views illustrating process steps in a method of fabricating the dual-gate FET shown in FIG. 8.

Initially, an n type GaAs active layer 2 is formed on the semi-insulating GaAs substrate 1 in the same process as described for the first embodiment of the invention. A source electrode 5 and a drain electrode 6, both comprising 200 nm thick AuGe/Ni, are formed on the active layer by vacuum evaporation and lift-off, and a lower layer 3b of a first gate electrode, comprising 300 nm thick WSi, is formed on the active layer 2 between the source electrode 5 and the drain electrode 6.

Thereafter, as illustrated in FIG. 9(a), a resist 12 is applied to the entire surface and an opening is formed in the resist 12 opposite a region between the first gate electrode lower layer 3b and the drain electrode 6 where a conductive region 11 is later produced.

In the step of FIG. 9(b), using the resist 12 as a mask, $Mg^+$ ions are implanted into the active layer 2 at an accelerating energy of 150 keV to form a p type GaAs conductive region 11. After removal of the resist 12, a 700 nm thick Au upper layer 3a is produced on the lower layer 3b in the same process as described with respect to FIG. 2(e) to complete a first gate electrode 3. In the dual-gate FET so produced, $L_{sg1}$=1.0 µm, $L_{g1}$=0.5 µm, $L_{g1p}$=1.0 µm, $L_p$=0.5 µm, and $L_{pd}$=0.7 µm.

Figure 10:
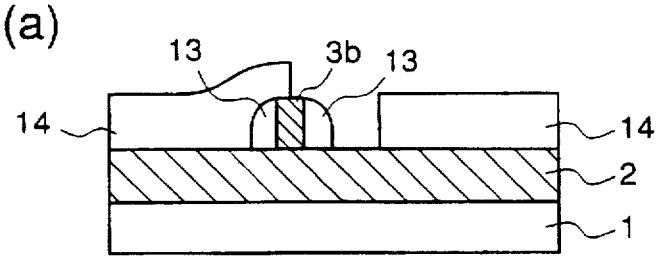
FIGS. 10(a) and 10(b) are cross-sectional views illustrating process steps in a method of fabricating the dual-gate FET according to the fourth embodiment of the invention.
Figure 10:
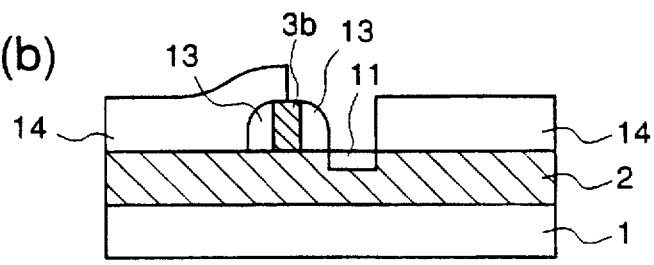

Another method of fabricating the dual-gate FET shown in FIG. 8 is shown in FIGS. 10(a) and 10(b). In this method, initially, an n type GaAs active layer 2 is formed on the semi-insulating GaAs substrate 1 in the same process as described for the first embodiment of the invention. Then, a lower layer 3b of a first gate electrode, comprising 300 nm thick WSi, is formed on the active layer 2. Thereafter, an SiO film is deposited over the entire surface and etched by ECR etching to form 400 nm thick SiO side walls 13 on the side surfaces of the first gate electrode lower layer 3b.

In the step of FIG. 10(a), a resist 14 is applied to the entire surface and patterned to form an opening opposite a region including a portion of the first gate electrode lower layer 3b, the side wall 13 on the drain side, and a portion of the active layer 2 where a conductive region 11 is later produced.

In the step of FIG. 10(b), using the resist 14, the first gate electrode lower layer 3b, and the side walls 13 as masks, $Mg^+$ ions are implanted into the active layer 2 at an accelerating energy of 150 keV, producing a p type GaAs conductive region 11. After removal of the resist 14 and the side walls 13, a source electrode 5 and a drain electrode 6, both comprising 200 nm thick AuGe/Ni, are formed by vacuum evaporation and lift-off technique. Further, a 700 nm thick Au upper layer 3a is produced on the lower layer 3b in the same process as described with respect to FIG. 2(e) to complete a first gate electrode 3. In the dual-gate FET so produced, $L_{sg1}$=1.0 µm, $L_{g1}$=0.5 µm, $L_{g1p}$=0.4 µm, $L_p$=0.5 µm, and $L_{pd}$=0.7 µm.

Figure 11:
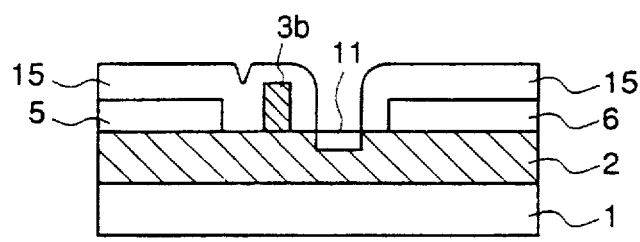
FIG. 11 is a cross-sectional view illustrating a process step in a method of fabricating the dual-gate FET according to the fourth embodiment of the invention.

FIG. 11 shows a process step in still another method of fabricating the dual-gate FET shown in FIG. 8. Initially, an n type GaAs active layer 2 is formed on the semi-insulating GaAs substrate 1 in the same process as described for the first embodiment of the invention. Thereafter, a source electrode 5 and a drain electrode 6, both comprising 200 nm thick AuGe/Ni, are produced on the active layer 2 by vacuum evaporation and lift-off, and a lower layer 3b of a first gate electrode, comprising 300 nm thick WSi, is formed on the active layer 2 between the source and drain electrodes 5 and 6.

In the step of FIG. 11, an SiO film 15 is deposited over the entire surface and patterned to form an opening opposite a region of the active layer 2 b e t ween the first gate electrode lower layer 3b and the drain electrode 6 where a conductive region 11 is later produced. Using the SiO film 15 as a mask, Zn is diffused from the surface of the n type GaAs active layer 2 with $ZnAs_2$ as a diffusion source, thereby producing a p type GaAs conductive region 11.

After removal of the SiO film 15, a 700 nm thick Au upper layer 3a is produced on the lower layer 3b in the same process as described with respect to FIG. 2(e) to complete a first gate electrode 3. In the dual-gate FET so produced, $L_{sg1}$=1.0 µm, $L_{g1}$=0.5 µm, $L_{g1p}$=1.0 µm, $L_p$=0.5 µm, and $L_{pd}$=1.0 µm.

Figure 12:
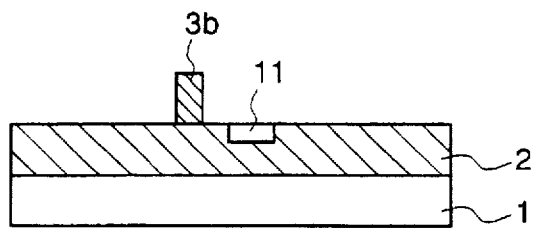
FIG. 12 is a cross-sectional view illustrating a process step in a method of fabricating the dual-gate FET according to the fourth embodiment of the invention.

FIG. 12 is a cross-sectional view illustrating a process step in yet another method of fabricating the dual-gate FET shown in FIG. 8. Initially, an n type GaAs active layer 2 is formed on the semi-insulating GaAs substrate 1 in the same process as described for the first embodiment of the invention. Next, a lower layer 3b of a first gate electrode, comprising 300 nm thick WSi, is formed on the active layer 2.

In the step of FIG. 12, $Mg^+$ ions are implanted into a region of the active layer 2 between the first gate electrode lower layer 3b and a region where a drain electrode is later produced, at an accelerating energy of 150 kev, using a focused ion beam, thereby producing a p type GaAs conductive region 11.

Thereafter, a source electrode 5 and a drain electrode 6, both comprising 200 nm thick AuGe/Ni, are formed on the active layer 2 by vacuum evaporation and lift-off. Further, a 700 nm thick Au upper layer 3a is produced on the lower layer 3b in the same process as described with respect to FIG. 2(e) to complete a first gate electrode 3. In the dual-gate FET so produced, $L_{sg1}$=1.0 µm, $L_{g1}$=0.5 µm, $L_{g1p}$=1.0 µm, $L_p$=0.5 µm, and $L_{pd}$=1.0 µm.

Figure 15:
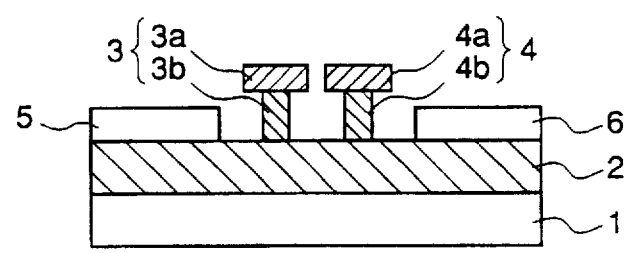
FIG. 15 is a cross-sectional view illustrating a conventional dual-gate FET having two double-layer gate electrodes.
Figure 16:
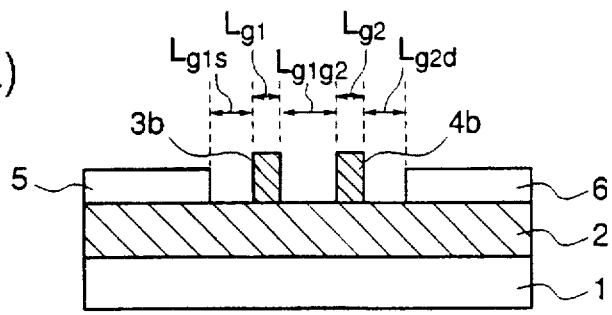
FIGS. 16(a)–16(f) are cross-sectional views illustrating process steps in a method of fabricating the dual-gate FET shown in FIG. 15.
Figure 16:
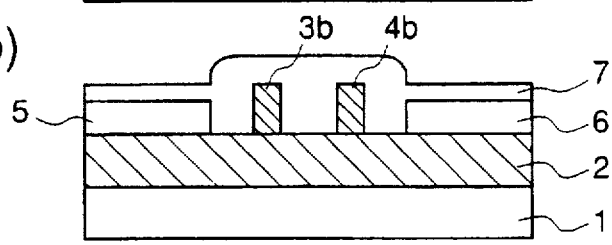
Figure 16:
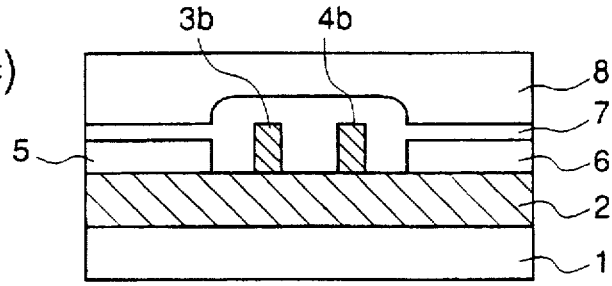
Figure 16:
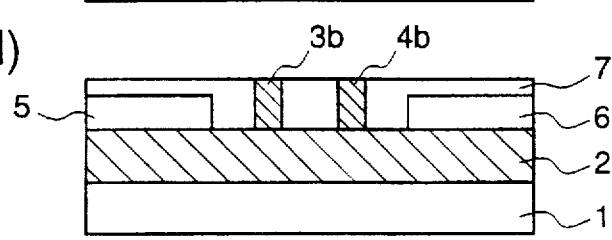
Figure 16:
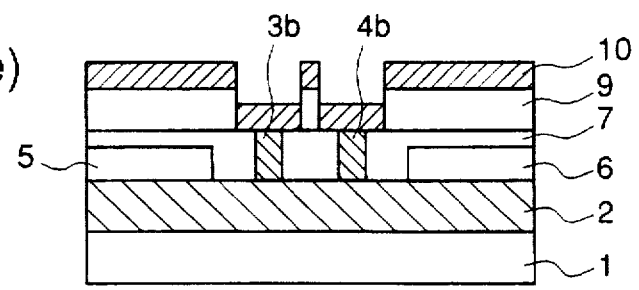
Figure 16:
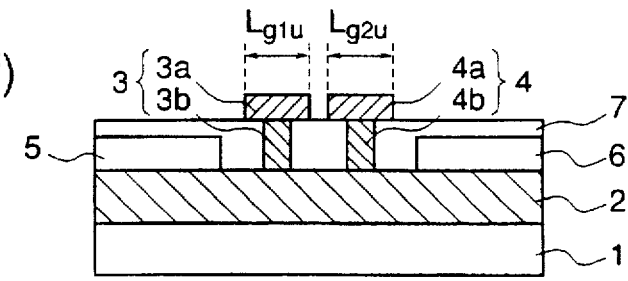

In the conventional dual-gate FET shown in FIG. 15, the second gate electrode to drain electrode distance $L_{g2d}$ is 2.0 µm and the first gate electrode to second gate electrode distance $L_{g1g2}$ is 2.0 µm. In the dual-gate electrode according to this fourth embodiment, the conductive region to drain electrode distance $L_{pd}$ is 0.7~1.0 µm, and the first gate electrode to conductive region distance $L_{g1p}$ is 0.4~1.0 µm. The conductive region to drain electrode distance $L_{pd}$ can be reduced to about 0.2 µm even considering the margin needed for patterning.

As described above, according to the fourth embodiment of the present invention, since the first gate electrode 3 is a T-shaped electrode having a double-layer structure, the gate resistance of the first gate electrode is reduced, resulting in an increase in efficiency and a reduction in noise during high frequency operation. Further, as a second gate receiving a d.c. voltage and controlling current flowing between the source and the drain in response to the d.c. voltage, not an electrode structure disposed on the active layer 2 but a p type GaAs conductive region 11 produced in the active layer 2 is employed. Therefore, the distance $L_{pd}$ between the conductive region 11 and the drain electrode 6 is reduced, and the distance $L_{g1p}$ between the first gate electrode 3 and the conductive region 11 is reduced, whereby the parasitic drain resistance is reduced by about 0.4 Ω compared with the conventional dual-gate FET. Further, since the source electrode to drain electrode distance is reduced, the size of the FET is reduced by about 10% compared with the conventional dual-gate FET. Furthermore, since the conductive region 11 corresponding to the second gate electrode is realized by a p type GaAs layer produced in the n type GaAs active layer 2, the structure and the fabrication process are simplified as compared with the second gate electrodes according to the first to third embodiments of the invention.

[Embodiment 5]

Figure 13:
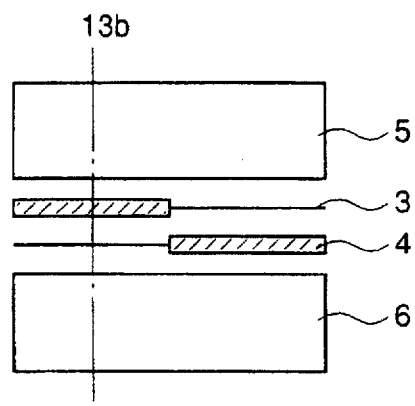
FIGS. 13(a) and 13(b) are a plan view and a cross-sectional view illustrating a dual-gate FET in accordance with a fifth embodiment of the present invention.
Figure 13:
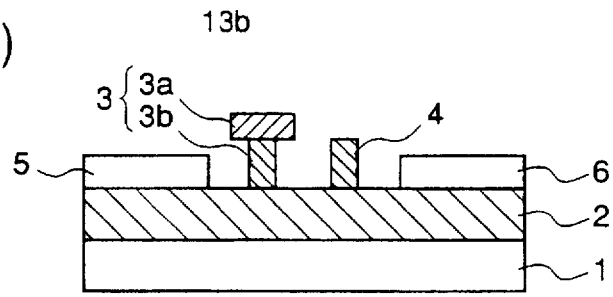
Figure 14:
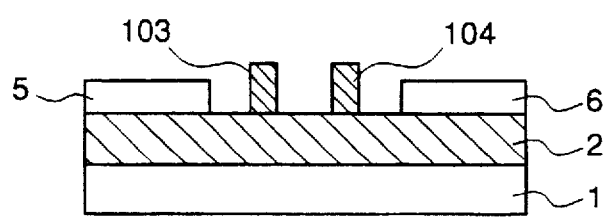
FIG. 14 is a cross-sectional view illustrating a conventional dual-gate FET having two single-layer gate electrodes.

FIG. 13(a) is a plan view illustrating a dual-gate FET according to a fifth embodiment of the present invention, and FIG. 13(b) is a cross-sectional view taken along a line 13b—13b in FIG. 13(a). In these figures, the same reference numerals as those shown in FIG. 1 designate the same or corresponding parts.

In this dual-gate FET, a source electrode 5 and a drain electrode 6 are disposed on the active layer 2, and a first gate electrode 3 and a second gate electrode 4 are disposed on the active layer 2 between the source electrode 5 and the drain electrode 6. In a half of the FET from the center of the FET in the direction perpendicular to the line 13b—13b, as shown in FIG. 13(b), the first gate electrode 3 is a T-shaped electrode comprising a 300 nm thick WSi lower layer 3b and a 700 nm thick Au upper layer 3a, and the second gate electrode 4 is a rectangular electrode comprising a 300 nm thick WSi layer. However, in the other half of the FET, the first gate electrode 3 is a rectangular electrode comprising a single WSi layer, and the second gate electrode 4 is a T-shaped electrode having the above-mentioned double-layer structure. This dual-gate FET is used as a mixer, and both the first gate electrode 3 and the second gate electrode 4 receive high frequency signals. This dual-gate FET is fabricated in a fabrication process similar to the fabrication process described for the first embodiment of the invention.

In the dual-gate FET according to this fifth embodiment of the invention, in a region where the first gate electrode 3 is a T-shaped double-layer electrode, the second gate electrode 4 is a rectangular single-layer electrode and, in a region where the first gate electrode 3 is a rectangular single-layer electrode, the second gate electrode 4 is a T-shaped double-layer electrode. Therefore, the gate resistances of these electrodes are reduced, whereby the high-frequency characteristics of the FET are improved. Further, compared with the conventional FET wherein both the first gate electrode and the second gate electrode are T-shaped from end to end, the source electrode to drain electrode distance is reduced, whereby the size of the FET is reduced.

What is claimed is:

1. A field effect transistor comprising:

an active layer having a surface;

a source electrode and a drain electrode disposed on the surface of the active layer and spaced apart in a gate length direction;

a first gate electrode disposed on the surface of the active layer between the source electrode and the drain electrode, having a T-shaped cross-section, and comprising a lower layer and an upper layer, the lower layer comprising a material having a resistivity and contacting the active layer, and the upper layer being disposed on the lower layer, comprising a material having a resistivity lower than the resistivity of the lower layer, and being longer than the lower layer in a direction parallel to the gate length direction; and a second gate electrode disposed on the surface of the active layer between the first gate electrode and the drain electrode, having a rectangular cross-section and a single layer.

2. The field effect transistor of claim 1 wherein the active layer has a gate recess at the surface, and the first gate electrode is disposed in the gate recess.

3. A field effect transistor comprising:

an active layer having a surface;

a source electrode and a drain electrode disposed on the surface of the active layer;

the active layer having, at the surface, a double-stage first gate recess between the source electrode and the drain electrode and a single-stage second gate recess between the first gate recess and the drain electrode, the double-stage first gate recess comprising a first-stage recess having an opening at the surface of the active layer and a second-stage recess having an opening at a bottom of the first-stage recess and a depth measured from the bottom of the first-stage recess, and the single-stage second gate recess having a depth equal to the depth of the second-stage recess;

a first gate electrode disposed in the second-stage recess of the double-stage first gate recess and comprising a lower layer and an upper layer, the lower layer comprising a material having a resistivity and contacting the active layer, and the upper layer being disposed on the lower layer and comprising a material having a resistivity lower than the resistivity of the lower layer; and a second gate electrode disposed in the signal-stage second gate recess.

4. A field effect transistor comprising:

an active layer having a surface and a first conductivity type;

a source electrode and a drain electrode disposed on the surface of the active layer and spaced apart in a gate length direction;

a gate electrode disposed on the surface of the active layer between the source electrode and the drain electrode and comprising a lower layer and an upper layer, the lower layer comprising a material having a resistivity and contacting the active layer, and the upper layer being disposed on the lower layer, comprising a material having a resistivity lower than the resistivity of the lower layer, and being longer than the lower layer in a direction parallel to the gate length direction; and an electrically conductive region in the active layer, reaching the surface of the active layer, spaced from, between, and electrically independent from the gate electrode and the drain electrode, the electrically conductive region having a second conductivity type opposite the first conductivity type, for controlling current flowing through the active layer.

5. A field effect transistor comprising:

an active layer having a surface;

a source electrode and a drain electrode disposed on the surface of the active layer and spaced apart in a gate length direction;

a first gate electrode disposed on the surface of the active layer between the source electrode and the drain electrode; and a second gate electrode disposed on the surface of the active layer between the first gate electrode and the drain electrode, wherein the field effect transistor is divided into first and second halves by a center line parallel to the gate length direction, and, in the first half, the first gate electrode has a T-shaped cross-section and comprises a lower layer and an upper layer, the lower layer comprising a material having a resistivity and contacting the active layer, and the upper layer being disposed on the lower layer, comprising a material having a resistivity lower than the resistivity of the lower layer, and being longer than the lower layer in a direction parallel to the gate length direction, while the second gate electrode has a rectangular cross-section and a single layer, and, in the second half of the field effect transistor, the first gate electrode has a rectangular cross-section and a single layer while the second gate electrode has a T-shaped cross-section and comprises a lower layer and an upper layer, the lower layer comprising a material having a resistivity and contacting the active layer, and the upper layer being disposed on the lower layer, comprising a material having a resistivity lower than the resistivity of the lower layer, and being longer than the lower layer in a direction parallel to the gate length direction.

* * * * *